United States Patent
Somerville et al.

(10) Patent No.: US 6,335,531 B1
(45) Date of Patent: Jan. 1, 2002

(54) MODIFICATION OF RESIST AND/OR RESIST PROCESSING WITH FLUORESCENCE DETECTION

(75) Inventors: Linda K. Somerville; Richard D. Holscher; Kenneth H. Somerville, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/291,652

(22) Filed: Apr. 6, 1999

(51) Int. Cl.[7] ...................................................... G01J 1/58
(52) U.S. Cl. ...................................... 250/459.1; 250/458.1
(58) Field of Search ............................ 250/459.1, 458.1, 250/461.1, 302; 356/237.5, 237.1, 237.2, 237.3, 237.4

(56) References Cited

U.S. PATENT DOCUMENTS

| | | | | |
|---|---|---|---|---|
| 4,482,424 A | * | 11/1984 | Katzir et al. | 156/626 |
| 5,225,675 A | * | 7/1993 | O'Donnell | 250/302 |
| 5,518,656 A | * | 5/1996 | Furuta et al. | 252/301.9 |

* cited by examiner

Primary Examiner—Georgia Epps
Assistant Examiner—Richard Hanig
(74) Attorney, Agent, or Firm—Dickstein Shapiro Morin & Oshinsky, LLP

(57) ABSTRACT

The detectability of photoresist is enhanced through the addition of materials to enhance the fluorescence of photoresist such that residual photoresist that either does not fluoresce or fluoresces at an emission wavelength shorter that that which can be detected using existing automatic resist inspection tools. In one embodiment of the invention, a benign tag that does not interfere with the photochemistry of the photoresist is added to the photoresist before it is processed. In a second embodiment of the invention, a tag is introduced onto a surface on which residual photoresist may be present such that the tag is absorbed or adsorbed by the residual photoresist, thereby rendering the residual photoresist easily detectable. The tag may be introduced onto the surface in a solution.

47 Claims, 1 Drawing Sheet

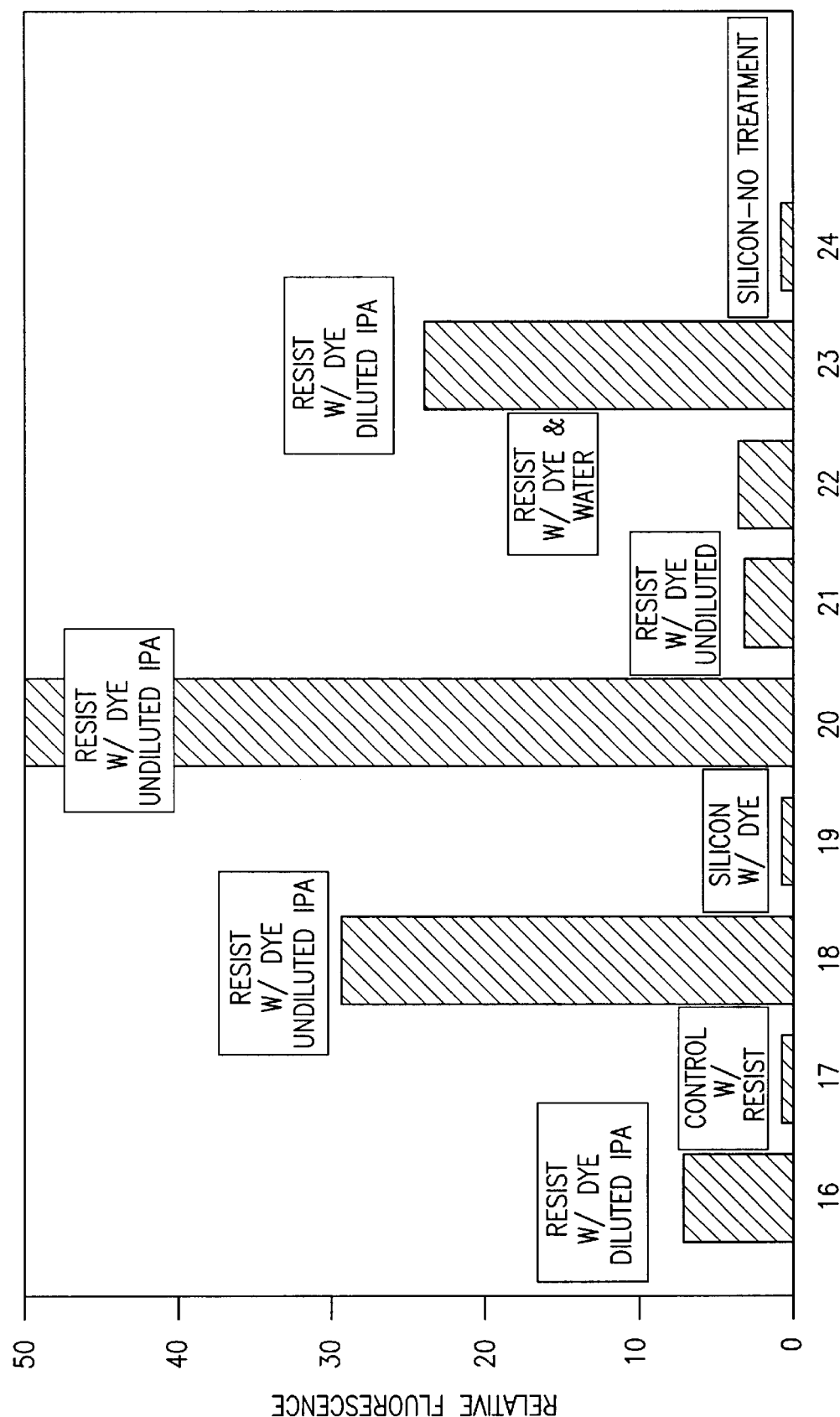

MODIFICATION OF RESIST AND/OR RESIST PROCESSING WITH FLUORESCENCE DETECTION

BACKGROUND OF THE INVENTION

1. Field of the Invention

The present invention relates generally to the field of integrated circuit fabrication, and more specifically to the detection of residual photoresist through fluorescence.

2. Description of the Related Art

Photolithography is commonly used for fabricating integrated circuits. Photolithography involves coating a surface to be etched, such as a semiconductor wafer, with photoresist and exposing the photoresist to light (usually at a specific wavelength) according to a desired pattern. Depending upon whether negative or positive photoresist is used, either the portions of the photoresist exposed to the light or the portions of the photoresist not exposed to the light are removed, leaving behind a photoresist mask. This process is referred to as developing the photoresist. The photoresist mask protects the portions of the surface covered by the mask while the portions of the surface not covered by the mask are etched, thereby producing a desired pattern (the negative of the mask) in the surface.

The photoresist mask must be removed after the surface has been etched, as any photoresist not removed will adversely affect subsequent processing of the wafer and/or performance of the completed integrated circuit. However, removing photoresist is not always easy. Typically, the photoresist is dry-etched and then a cleaning solution, such as a piranha solution (used when non-metals have been etched) or hot phosphoric acid (used when metals are etched), is used to wash away photoresist. Often photoresist is left behind or, after it has initially been dislodged by the cleaning solution, reattaches to another area of the surface. Photoresist not removed by the cleaning process is referred to herein as residual photoresist. Because residual photoresist adversely affects the final product, it is important to detect residual photoresist so it can be removed.

One method to detect residual photoresist is to visually inspect the surface with the aid of an optical microscope. This method is not very effective, however. It is difficult to distinguish photoresist from many surfaces, and such techniques are inherently time-consuming, must be done manually, and are therefore expensive.

Another method for detecting residual photoresist takes advantage of fluorescence. Fluorescence is the emission of light or other electromagnetic radiation of a longer wavelength by a substance as a result of the absorption of shorter wavelengths, provided the emission continues only as long as the stimulus producing it is maintained. Organic materials such as photoresist have characteristic light absorption and emission patterns, or spectra. The wavelength of radiation that causes fluorescence shall be referred to herein as the excitation wavelength, while the wavelength of the emitted radiation shall be referred to herein as the emission wavelength. It should be understood, however, that both "excitation wavelength" and "emission wavelength" refer to a range of wavelengths norminally represented by the single wavelength referred to. In other words, if a substance is said to have an excitation wavelength of 325 nm, it should be understood that radiation at a wavelength of approximately 325 nm will cause the substance to emit radiation to varying degrees–325 nm represents a spectrum of wavelengths approximately equal to 325 nm. The emission wavelength is always shifted toward longer wavelengths (lower energy) as compared to the excitation wavelength. This is known as Stokes' shift.

Fluorescence can be used to detect residual photoresist by irradiating the surface with radiation at the excitation wavelength of the photoresist and substantially simultaneously detecting light emitted by the photoresist at the emission wavelength. Because the emission wavelength of photoresist is different from the wavelength of the radiation reflected by the surface, any fluorescing residual photoresist is easily detected. Machines such as the apparatus described in U.S. Pat. No. 4,800,282, the contents of which are hereby incorporated by reference herein, have been developed to automatically detect the presence of radiation at the emission wavelength of photoresist, thereby automating the residual photoresist inspection process. Such a machine is often referred to as an ARI (Automatic Resist Inspection) tool.

A problem with the use of ARIs has recently surfaced. Many ARIs in use today work well for photoresists with relatively longer wavelengths. For example, a common ARI in use today is capable of detecting emission wavelengths of approximately 590 nm and above. This ARI is well-suited for use with i-line photoresist, which has an exposure wavelength of approximately 365 nm, an excitation wavelength of approximately 530 nm and an emission wavelength of approximately 600 nm. As integrated circuit geometry continues to shrink, manufacturers have necessarily turned to photoresists with shorter exposure wavelengths to realize the higher resolution required for smaller integrated circuit geometries.

The use of deep ultraviolet (DUV) photoresist, with an exposure wavelength of 248 nm, has become increasingly common (i-line photoresist is opaque at this wavelength). However, the chemistry of DUV photoresist is different from previous photoresists such i-line photoresist. I-line photoresists are typically based on a diazonapthoquinone/novolac resin. DUV photoresists, on the other hand, typically comprise a photopolymer that is a derivative of poly-hydroxystyrene and an onium salt photoacid generator. The photopolymer should fluoresce at an excitation wavelength of approximately 325 nm and an emission wavelength of approximately 420 nm. However, experience has shown that it does not. It is thought that the onium salt photoacid generator inhibits fluorescence of the DUV photoresist. In any event, the failure of the DUV photoresist to fluoresce; or, even if it did fluoresce, the existence of an emission wavelength shorter than that which can be detected by many existing ARIs (which often have filters that will only pass radiation above 525 nm onto a sample and only pass radiation above 590 nm onto the sensor), presents a serious problem to integrated circuit manufacturers.

What is needed is a photoresist with a shorter exposure wavelength whose residue fluoresces such that existing automatic resist inspection tools can detect its presence.

SUMMARY OF THE INVENTION

The invention overcomes to a great extent the aforementioned problems by providing for the addition of materials to enhance the fluorescence of a photoresist such that otherwise undetectable residual photoresist can be detected using existing automatic resist inspection tools. In one embodiment of the invention, a benign tag that does not interfere with the photochemistry of the photoresist is added to the photoresist before it is processed. In a second embodiment of the invention, a tag is introduced onto a surface on which residual photoresist may be present such that the tag is absorbed or adsorbed by the residual photoresist, thereby rendering the residual photoresist easily detectable. The tag may be incorporated into the cleaning solution, or the cleansed wafer may be rinsed with a separate solution containing the tag for subsequent inspection.

BRIEF DESCRIPTION OF THE DRAWING

The foregoing and other advantages and features of the invention will become more apparent from the detailed description of the preferred embodiments of the invention given below with reference to the accompanying drawing in which:

FIG. 1 is a bar graph indicating the fluorescence values of residual photoresist both with and without an added tag according to one embodiment of the present invention.

DETAILED DESCRIPTION OF THE PREFERRED EMBODIMENTS

The present invention will be illustrated through a description of the addition of a tag which is either added to photoresist prior to processing it or which is absorbed or adsorbed by residual photoresist after processing. Numerous specific details, such as materials, thicknesses, etc., are set forth in order to provide a thorough understanding of the present invention. It will be obvious, however, to one skilled in the art that the present invention is capable of many different embodiments and that the present invention may be practiced without the specific details set forth herein. Accordingly, the drawing and description herein are to be regarded as illustrative in nature and not as restrictive.

One embodiment of the present invention involves adding a tag to photoresist before the photoresist is applied and processed. The specific tag chosen ideally will be a tag having an emission and excitation wavelength that corresponds to a desired ARI tool's capabilities. The tag must also be chosen such that it does not interfere with the photochemistry of the resist. The basic reaction is a chemically amplified acid reaction. Determining the correct tag must often be done through trial and error as photoresist manufacturers often add other special additives and closely guard the specific ingredients of their photoresists.

One class of widely used photoresist are acetal-based DUV photoresists. It is believed that a dye known as Cresyl Violet can be added to acetal-based DUV photoresists without adversely affecting the photochemistry of the photoresists. Cresyl Violet has an excitation wavelength of approximately 600 nm and an emission wavelength of approximately 670 nm. This dye is capable of use with a wide range of commercially available photoresists. Cresyl Violet may be added to the photoresist in the approximate ratio of 0.1 gram of Cresyl Violet per liter of photoresist. The photoresist with the Cresyl Violet tag can be then used in the same manner as photoresist is now used in integrated circuit fabrication.

A second embodiment of the invention involves introducing a tag onto a surface which may contain residual photoresist. The tag may be introduced by adding the tag to a cleaning solution used to remove the photomask after the dry etch of the photoresist has been completed, or the tag may be introduced by rinsing the surface with the tag (or a solution containing the tag) after the cleaning solution has been applied so that the tag is absorbed or adsorbed by any residual photoresist. In this manner, the tag remains on the surface where it has been absorbed or adsorbed by residual photoresist and exhibits excitation and emission wavelengths such that detection of the residual photoresist can be accomplished by existing ARIs. The tag does not adhere to areas of the surface not having residual photoresist. Once again, the actual tag chosen will depend upon the chemistry of the specific photoresist with which the tag is used.

Cresyl Violet can also be used to detect photoresist in this manner. FIG. 1 illustrates the improvement in relative fluorescence that can be achieved through the use of Cresyl Violet for post-processing residual photoresist tagging. FIG. 1 shows by bar graph the fluorescence results achieved in experiments conducted to demonstrate post-processing residual acetal-based DUV photoresist tagging. It should be noted that the values shown in FIG. 1 are average values taken over many trials. In the bar graph of FIG. 1, bar 24 illustrates that the fluorescence of bare silicon is approximately 0. Bar 17 illustrates that the fluorescence of silicon coated with a layer of acetal-based DUV photoresist approximately 7850Å thick is also approximately 0. This confirms that residual photoresist of this type does not fluoresce and thus cannot be detected with an ARI.

Bar 19 illustrates that the fluorescence of silicon which has been rinsed with undiluted Cresyl Violet dye (as discussed above, actually a small amount of solvent is necessary to get the dye into solution) is also approximately 0. This demonstrates that the dye will not adhere to the silicon surface in the absence of residual photoresist.

Bars 18 and 20 illustrate the high relative fluorescence values that can be achieved when Cresyl Violet dye mixed with undiluted isopropyl alcohol (abbreviated as IPA in FIG. 1) is introduced onto a silicon surface covered with a 7850 Å thick layer of the same acetal-based DUV photoresist. The mixture ratio of the dye to the isopropyl alcohol used in the experiments corresponding to bars 18 and 20 is approximately 0.1 gram of Cresyl Violet per liter of isopropyl alcohol. Bars 18 and 20 demonstrate that a Cresyl Violet/isopropyl alcohol solution is absorbed or adsorbed by residual photoresist, thereby allowing residual photoresist to be detected with an ARI.

Bars 23 and 16 illustrate the relative fluorescence performance of the Cresyl Violet dye mixed with different dilutions of isopropyl alcohol in water when introduced onto a silicon surface with a 7850Å thick layer of acetal-based DUV photoresist. The isopropyl alcohol was diluted with water at a ratio of 7 parts alcohol to 3 parts water (70% solution) in Bar 23 and a ratio of 1 part alcohol to 9 parts water (10% solution) in Bar 16. The ratio of the dye to the diluted isopropyl alcohol in bars 23 and 16 is again approximately 0.1 gram of Cresyl Violet per liter of diluted isopropyl alcohol. This demonstrates that residual photoresist on a surface will absorb or adsorb a Cresyl Violet tag in an aqueous solution (many cleaning solutions are aqueous), thereby again allowing detection of the residual photoresist with an ARI.

Bar 22 illustrates the relative fluorescence of the same photoresist-covered silicon surface when Cresyl Violet dye diluted only with water is introduced, while Bar 21 illustrates the relative fluorescence of the same surface when undiluted Cresyl Violet is introduced. Although the relative fluorescence shown in Bars 22 and 21 are low, they are still much better than the relative fluorescence that can be achieved without the dye as illustrated in Bar 17. Accordingly, it may be useful to use either undiluted dye or dye diluted only with water under some circumstances.

Table 1 below illustrates other commercially available materials are believed to be useful as tags for different photoresists. The materials listed in Table 1 all have emission wavelengths greater than 590 nm; thus, they may be used as a photoresist tag with many existing ARIs. The CAS values in the following table represent the Chemical Abstract Service registry number of the corresponding material.

TABLE 1

| Emission Wavelength (in Angstroms) | Material | CAS NUMBER/TRADE NAME/CHEMICAL NAME |
|---|---|---|
| 7750 | NCl | LC7750 |
| 7800 | Methyl-DOTCI | 3,3'-Dimethyloxatricarbocyanine Iodide |
| 7950 | Styryl 11 | 92479-59-9 |
| 8000 | Rhodamine 800 | 101027-54-7 |
| 8400 | Styryl 9 | LC8400 |
| 8410 | Styryl 9 (M) | 120528-73-6 |
| 8630 | IR 125 | 3599-32-4 |
| 8760 | DTTCl | 3071-70-3 |
| 8800 | IR 144 | 54849-69-3 |
| 8810 | Styryl 15 | LC8810 |
| 8850 | DNTTCl | LC8850 |
| 9300 | DDCl-4 | 1,2'-Diethyl-4,4',-dicarbocyanine Iodide |
| 9450 | Styryl 14 | LC9450 |
| 9500 | IR 132 | 62669-62-9 |
| 9940 | Styryl 20 | LC9940 |
| 10600 | IR 25 | LC10600 |
| 5900 | Rhodamine 6G | 989-38-8 |
| 5901 | Rh. 6G (Perchl.) | LC5901 |
| 6100 | Rhodamine B | 81-88-9 |
| 6101 | Rhodamine B (Perchl.) | LC6101 |
| 6200 | Sulforhodamine B | 3520-42-1 |
| 6400 | Rhodamine 101 | 64339-18-0 |
| 6500 | DCM | 51325-91-8 |
| 5920 | DQOCl | LC5920 |
| 6501 | DCM-special | LC6501 |
| 5950 | DCl-2 | LC5950 |
| 6600 | Sulforhodamine 101 | LC6600 |
| 6220 | Malachite Green | LC6220 |
| 6700 | Cresyl Violet | 41830-80-2 |
| 6250 | DTCl | 3,3'-Diethylthiacarbocyanine Iodide |
| 6750 | Phenoxazone 9 | 7385-67-3 |
| 6290 | DQTCl | 1,3'-Diethyl-4,2'-quinolylthiacarbocyanine Iodide |
| 6900 | Nile Blue | 53340-16-2 |
| 6550 | DODCl | 3,3'-Diethyloxadicarbocyanine Iodide |
| 6950 | Oxazine 4 | 3-Ethylamino-7-ethylimino-2,8-dimethylphenoxazin-5ium P |
| 7260 | DTDCl | 3-Diethylthiadicarbocyanine Iodide |
| 7000 | Rhodamine 700 | LC7000 |
| 7400 | HIDCl | 36536-22-8 |
| 7100 | Pyridine 1 | 1-ethyl-2-(4-(p-Dimenthlaminophenyl)-1,3-butadienyl)-pyridi |
| 7450 | Cryptocyanine | 4727-50-8 |
| 7210 | Oxazine 170 | 62669-60-7 |
| 7700 | DDl | 14187-31-6 |
| 7250 | Oxazine 1 | 24796-94-9 |
| 7880 | DOTCl | LC7880 |
| 7270 | Oxazine 750 | LC7270 |
| 8500 | HITCl | 19764-96-6 |
| 7300 | Pyridine 2 | 1-ethyl-4-(4-(p-Dimenthlaminophenyl)-1,3-butadienyl)-pyridi |
| 9200 | HDITCl | 23178-67-8 |
| 7500 | Styryl 6 | 2-(4-(p-Dimenthlaminophenyl)-1,3-butadienyl)-1,3,3-trimeth |
| 9310 | IR 140 | 53655-17-7 |
| 7550 | Styryl 8 | 76433-29-9 |
| 10800 | IR 26 | 76871-75-5 |
| 7710 | Pyridine 4 | 1-ethyl-4-(4-(9-(2,3,6,7-tetrahydro-1H,5H-benzol(l,j)-chinoliz |
| 10900 | IR 5 | 61010-01-3 |

The use of a fluorescent additive (or tag) that allows residual photoresist to be detected using existing ARI tools has been demonstrated. In one embodiment, the additive is mixed with the photoresist before the photoresist is applied and processed. In a second embodiment, the additive is included in a solution which is introduced onto a surface and absorbed or adsorbed by residual photoresist to allow its detection. In a preferred embodiment, Cresyl Violet is used as the additive, but other identified additives may also be used. The invention has been described in connection with integrated circuit fabrication, but those of ordinary skill in the art will recognize that it is useful for other applications involving photoresist such as printed circuit board manufacturing.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for detecting photoresist remaining on a surface after a photoresist cleaning process has been performed, the method comprising the steps of:
   adding a material having an excitation wavelength and emission wavelength to a photoresist provided on the surface;
   irradiating the surface with radiation at the excitation wavelength of the added material; and
   detecting radiation at the emission wavelength of the added material.

2. The method according to claim 1, wherein the irradiating step and the detecting step are performed substantially simultaneously and detected radiation at the emission wavelength indicates the presence of photoresist.

3. The method of claim 1, wherein the adding step is performed by mixing the material with the photoresist before the photoresist is provided on the surface.

4. The method of claim 3, wherein the material is a dye.

5. The method of claim 3, wherein the material is Cresyl Violet.

6. The method of claim 3, wherein the ratio of material to photoresist is approximately 0.1 gram of material per liter of photoresist.

7. The method of claim 1, wherein the adding step is performed during the cleaning process by adding the material to a cleanser used in the cleaning process, the material being absorbed or adsorbed by photoresist not removed from the surface by the cleaning process.

8. The method of claim 7, wherein the cleanser is a piranha solution.

9. The method of claim 7, wherein the cleanser is a phosphoric acid solution or phosphoric acid.

10. The method of claim 7, wherein the material is a dye.

11. The method of claim 7, wherein the material is Cresyl Violet.

12. The method of claim 7, wherein the ratio of material to cleanser is approximately 0.1 gram of material per liter of cleanser.

13. The method of claim 1, wherein the adding step is performed after the cleaning process by applying the material to the surface, the material being absorbed or adsorbed by photoresist remaining on the surface after the cleaning process.

14. The method of claim 13, wherein the material in a solvent solution is applied to the surface.

15. The method of claim 14, wherein the solvent is alcohol.

16. The method of claim 15, wherein the ratio of applied material to alcohol is approximately 0.1 gram of material per liter of alcohol.

17. The method of claim 15, wherein the alcohol is isopropyl alcohol.

18. The method of claim 13, wherein the applied material is diluted with water.

19. The method of claim 18, wherein the ratio of material to water is approximately 0.1 gram of material per liter of water.

20. The method of claim 13, wherein the material is diluted with water and alcohol.

21. The method of claim 20, wherein the ratio of the material to the water and alcohol is approximately 0.1 gram of material per liter of water and alcohol.

22. The method of claim 20, wherein the ratio of water to alcohol is nine to one.

23. The method of claim 13, wherein the material is a dye.

24. The method of claim 13, wherein the material is Cresyl Violet.

25. The method of claim 1, wherein the material has an emission wavelength greater than approximately 590 nanometers.

26. The method of claim 1, wherein the material is a material selected from the group consisting of Styryl 20, Styryl 6, Styryl 8, Styryl 9, Styryl 9(M), Styryl 11, Styryl 14, and Styryl 15.

27. The method of claim 1, wherein the material is a material selected from the group consisting of IR 5, IR 25, IR 26, IR 125, IR 132, IR 140, and IR 144.

28. The method of claim 1, wherein the material is a material selected from the group consisting of DOTCI, Methyl-DOTCI, DTTCI, DNTTCI, DDCI-4, DQOCI, DCM, DCM-special, DCI-2, DTCI, DQTCI, DODCI, DTDCI, and DDI.

29. The method of claim 1, wherein the material is a material selected from the group consisting of Rhodamine 800, Rhodamine 6G, Rhodamine 6G (Perchl.), Rhodamine B, Rhodamine B (Perchl.), Rhodamine 101, and Rhodamine 700.

30. The method of claim 1, wherein the material is a material selected from the group consisting of Phenoxazone 9, Oxazine 4, Oxazine 170, Oxazine 1, and Oxazine 750.

31. The method of claim 1, wherein the material is a material selected from the group consisting of NCI, Sulforhodamine B, Sulforhodamine 101, Malachite Green, Nile Blue, Pyridine 1, Pyridine 2, Pyridine 4, Cryptocyanine, HITCI, and HDITCI.

32. The method of claim 1, wherein the photoresist is acetal-based.

33. A material with a fluorescent residue, the material comprising:
 a photoresist having an exposure wavelength of approximately 248 nanometers; and
 a tag having an emission wavelength and an excitation wavelength, the emission wavelength being greater than 590 nanometers.

34. The material of claim 33, wherein the material is a material selected from the group consisting of Styryl 20, Styryl 6, Styryl 8, Styryl 9, Styryl 9(M), Styryl 11, Styryl 14, and Styryl 15.

35. The material of claim 33, wherein the material is a material selected from the group consisting of IR 5, IR 25, IR 26, IR 125, IR 132, IR 140, and IR 144.

36. The material of claim 33, wherein the material is a material selected from the group consisting of DOTCI, Methyl-DOTCI, DTTCI, DNTTCI, DDCI-4, DQOCI, DCM, DCM-special, DCI-2, DTCI, DQTCI, DODCI, DTDCI, and DDI.

37. The material of claim 33, wherein the material is a material selected from the group consisting of Rhodamine 800, Rhodamine 6G, Rhodamine 6G (Perchl.), Rhodamine B, Rhodamine B (Perchl.), Rhodamine 101, and Rhodamine 700.

38. The material of claim 33, wherein the material is a material selected from the group consisting of Phenoxazone 9, Oxazine 4, Oxazine 170, Oxazine 1, and Oxazine 750.

39. The material of claim 33, wherein the material is a material selected from the group consisting of NCI, Sulforhodamine B, Sulforhodamine 101, Malachite Green, Nile Blue, Cresyl Violet, Pyridine 1, Pyridine 2, Pyridine 4, Cryptocyanine, HITCI, and HDITCI.

40. The material of claim 33, wherein the ratio of the tag to the photoresist is approximately 0.1 grams of tag per liter of photoresist.

41. The material of claim 33, wherein the photoresist is acetal-based.

42. The material of claim 33, wherein the tag is a dye.

43. A mixture for removing photoresist from a surface and for detecting residual photoresist on the surface, the mixture comprising:
 a cleanser for removing photoresist from the surface, wherein the photoresist has an exposure wavelength of approximately 248 nanometers; and
 a material having an excitation wavelength and an emission wavelength added to the cleanser, wherein the emission wavelength is greater than 590 nanometers.

44. The mixture of claim 43, wherein the ratio of the material to the cleanser is approximately 0.1 grams of material per liter of cleanser.

45. A method capable of detecting residual photoresist on a surface after a photoresist cleaning process has been performed on the surface, the method comprising the steps of:
 applying a material to the surface upon which the photoresist cleaning process has been performed,
 the photoresist having an exposure wavelength, and the applied material having an excitation wavelength and an emission wavelength, the exposure wavelength being shorter than the excitation wavelength and the emission wavelength;
 irradiating the cleaned surface with radiation at the excitation wavelength of the applied material; and
 detecting radiation at the emission wavelength of the applied material so as to detect any residual photoresist.

46. The method of claim 45, wherein the applied material is adsorbed or absorbed by the residual photoresist.

47. A method capable of detecting residual photoresist on a surface after a photoresist cleaning process has been performed on the surface, the method comprising the steps of:
 applying a material to the surface upon which the photoresist cleaning process has been performed,
 the photoresist having an exposure wavelength of approximately 248 nanometers, and the applied material having an excitation wavelength and an emission wavelength, the emission wavelength being greater than 590 nanometers;
 irradiating the cleaned surface with radiation at the excitation wavelength of the applied material; and
 detecting radiation at the emission wavelength of the applied material so as to detect any residual photoresist.

* * * * *